(12) United States Patent
Oishi et al.

(10) Patent No.: US 6,533,158 B2
(45) Date of Patent: Mar. 18, 2003

(54) WIRE BONDING APPARATUS HAVING WIRE CLAMP

(75) Inventors: Junichiro Oishi, Tokyo (JP); Noriyuki Kubota, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/984,255

(22) Filed: Oct. 29, 2001

(65) Prior Publication Data

US 2002/0040920 A1 Apr. 11, 2002

(30) Foreign Application Priority Data

Oct. 11, 2000 (JP) ........................................ 2000-342810

(51) Int. Cl.[7] .............................................. B23K 37/04
(52) U.S. Cl. ........................................ 228/4.5; 228/44.7
(58) Field of Search ............................... 228/4.5, 180.5, 228/110.1, 212, 213, 44.3, 44.7–49.5; 269/275, 22, 20

(56) References Cited

U.S. PATENT DOCUMENTS

| | | | | |
|---|---|---|---|---|
| 3,412,991 A | * | 11/1968 | Naples, Jr. et al. ............ 269/35 |
| 4,284,267 A | * | 8/1981 | Marben ........................ 269/266 |
| 4,928,871 A | * | 5/1990 | Farassat ..................... 228/180.5 |
| 5,090,759 A | * | 2/1992 | Sato et al. .................. 294/119.3 |
| 5,657,972 A | * | 8/1997 | Blatt ............................ 269/22 |

* cited by examiner

*Primary Examiner*—Tom Dunn
*Assistant Examiner*—Jonathan Johnson
(74) *Attorney, Agent, or Firm*—Sughrue Mion, PLLC

(57) ABSTRACT

Disclosed is a wire bonding apparatus which has a structure as simple and as light as possible, which substantially reduces the inertia in a Z-direction rotating portion swinging at a high speed in the Z-direction, and which can realize a stable high-speed swinging of the Z-direction rotating portion while restraining vibration. A wire bonding apparatus (21) is arranged on a base capable of moving in X- and Y-directions by an XY stage, and is equipped with a wire clamp (22) rotatable in the Z-direction perpendicular to the X- and Y-directions. A driving portion (15) imparts a wire gripping force to the wire clamp. An elastic sack-like member (14) is arranged on the wire clamp and adapted to change its shape by a fluid introduced by the driving portion (15) through a tube (23), to thereby generate a wire gripping force.

8 Claims, 10 Drawing Sheets

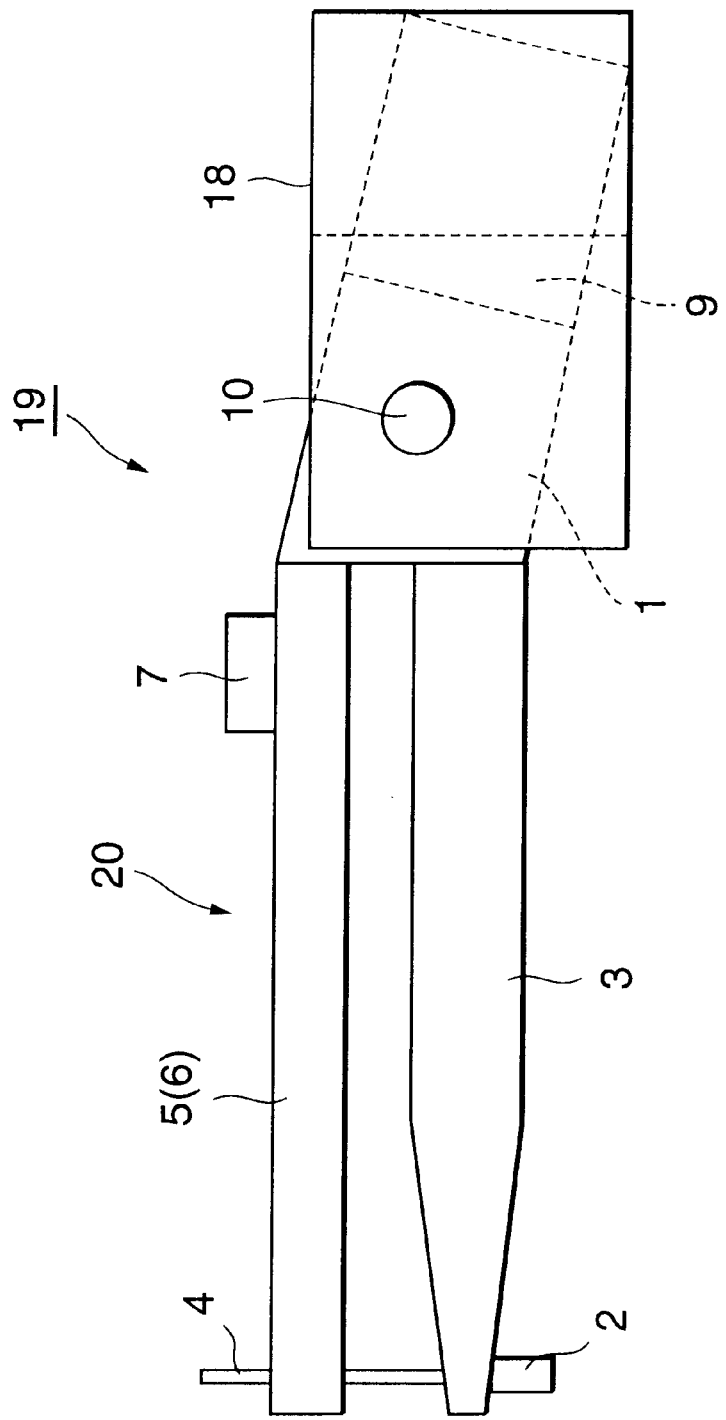

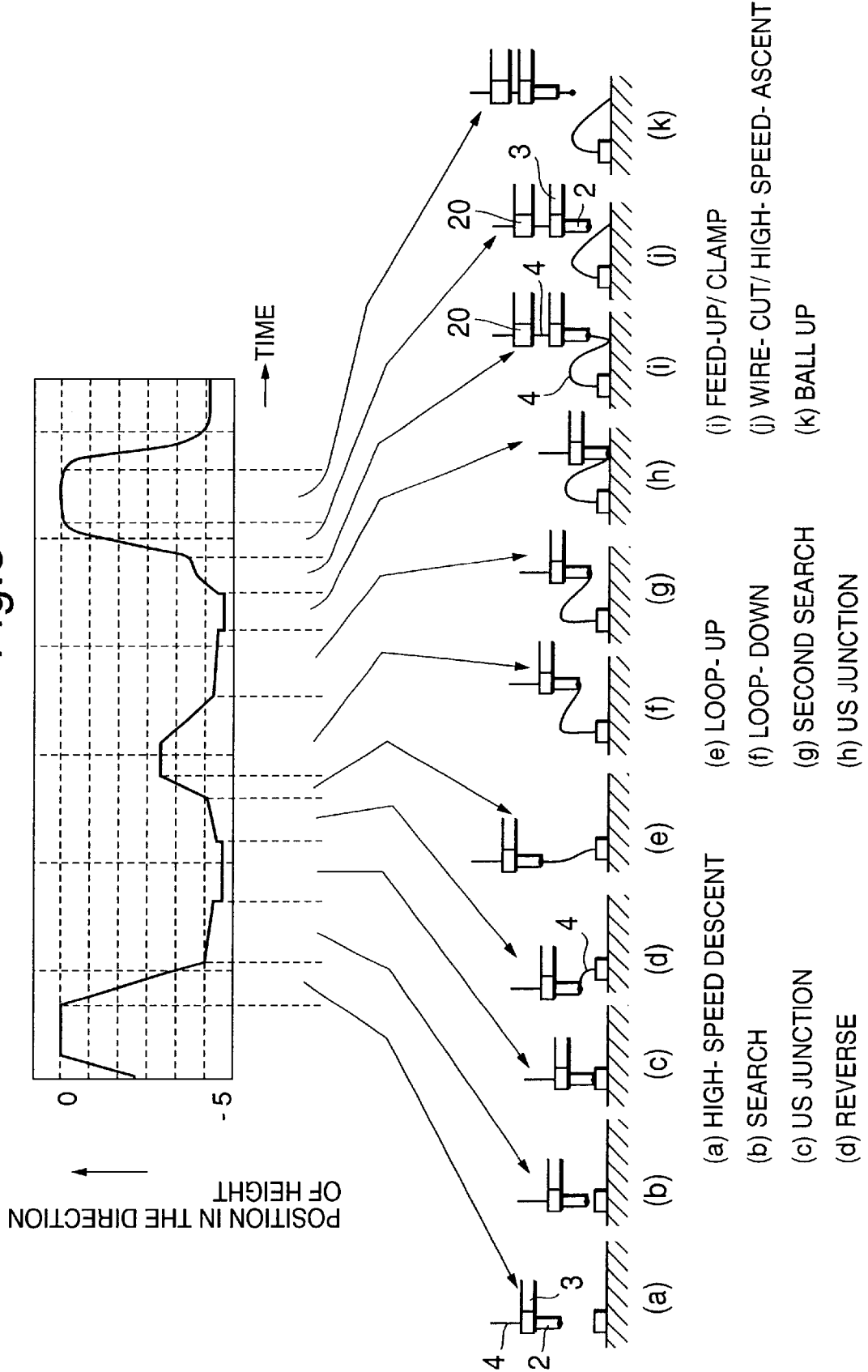

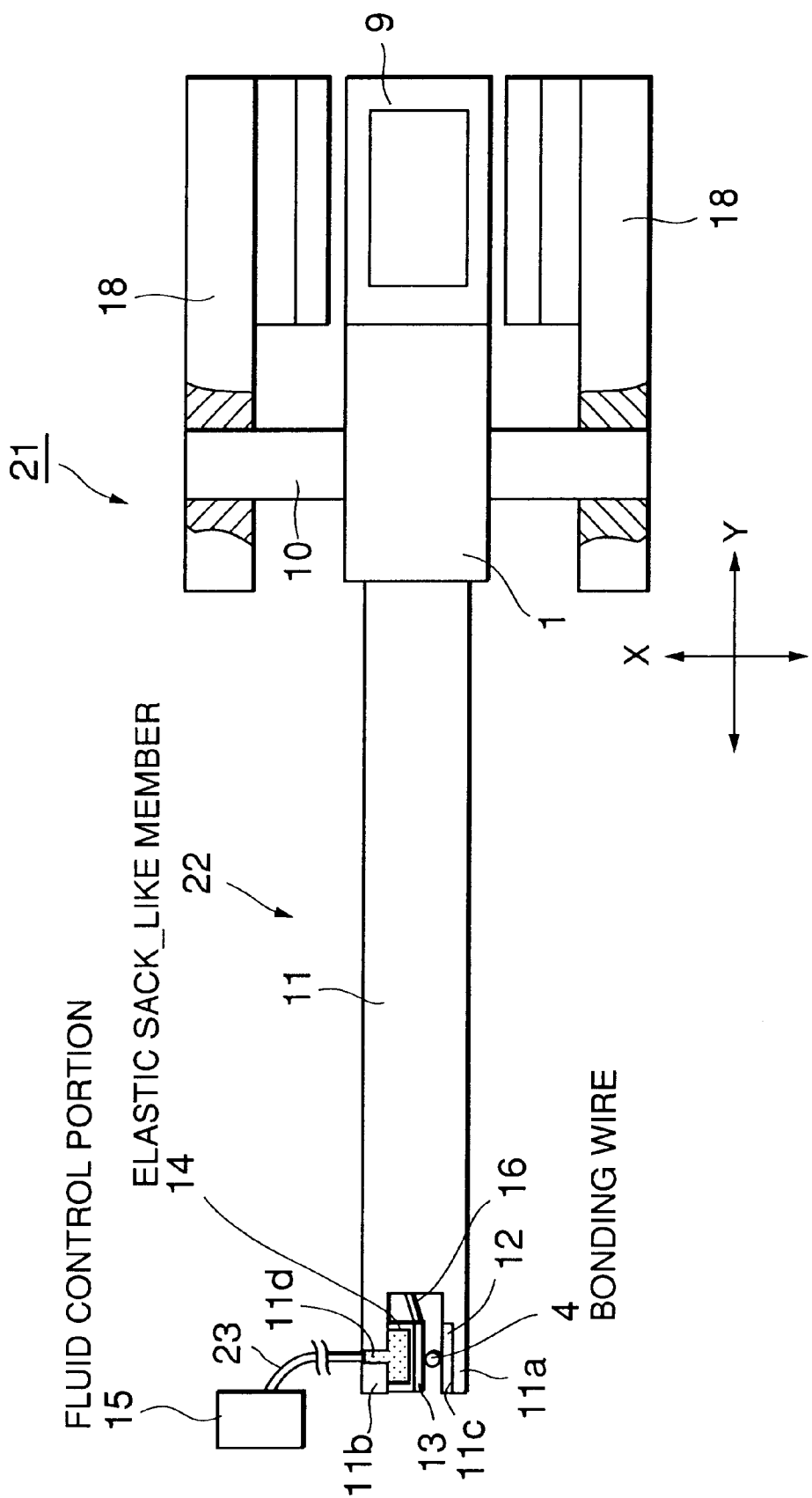

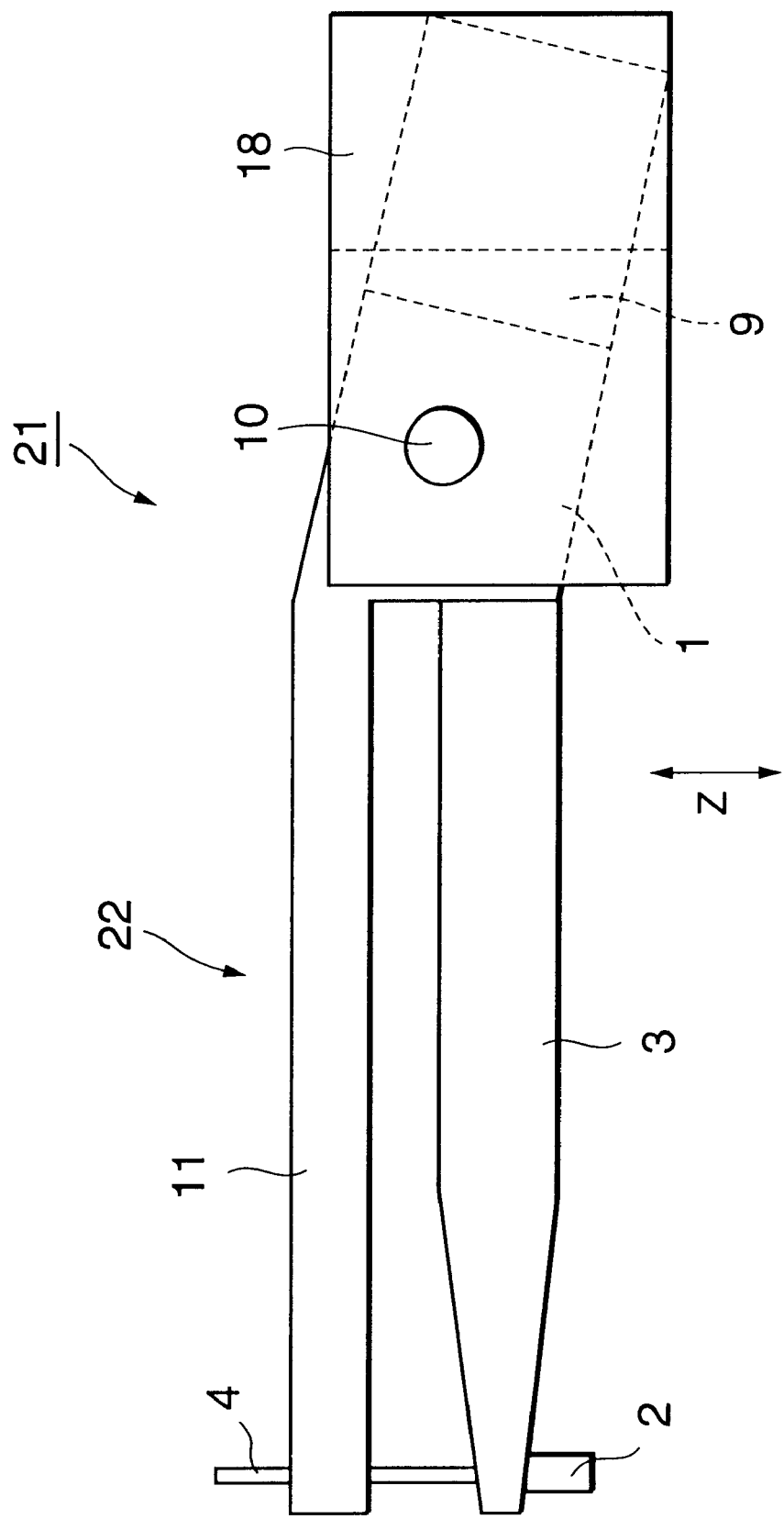

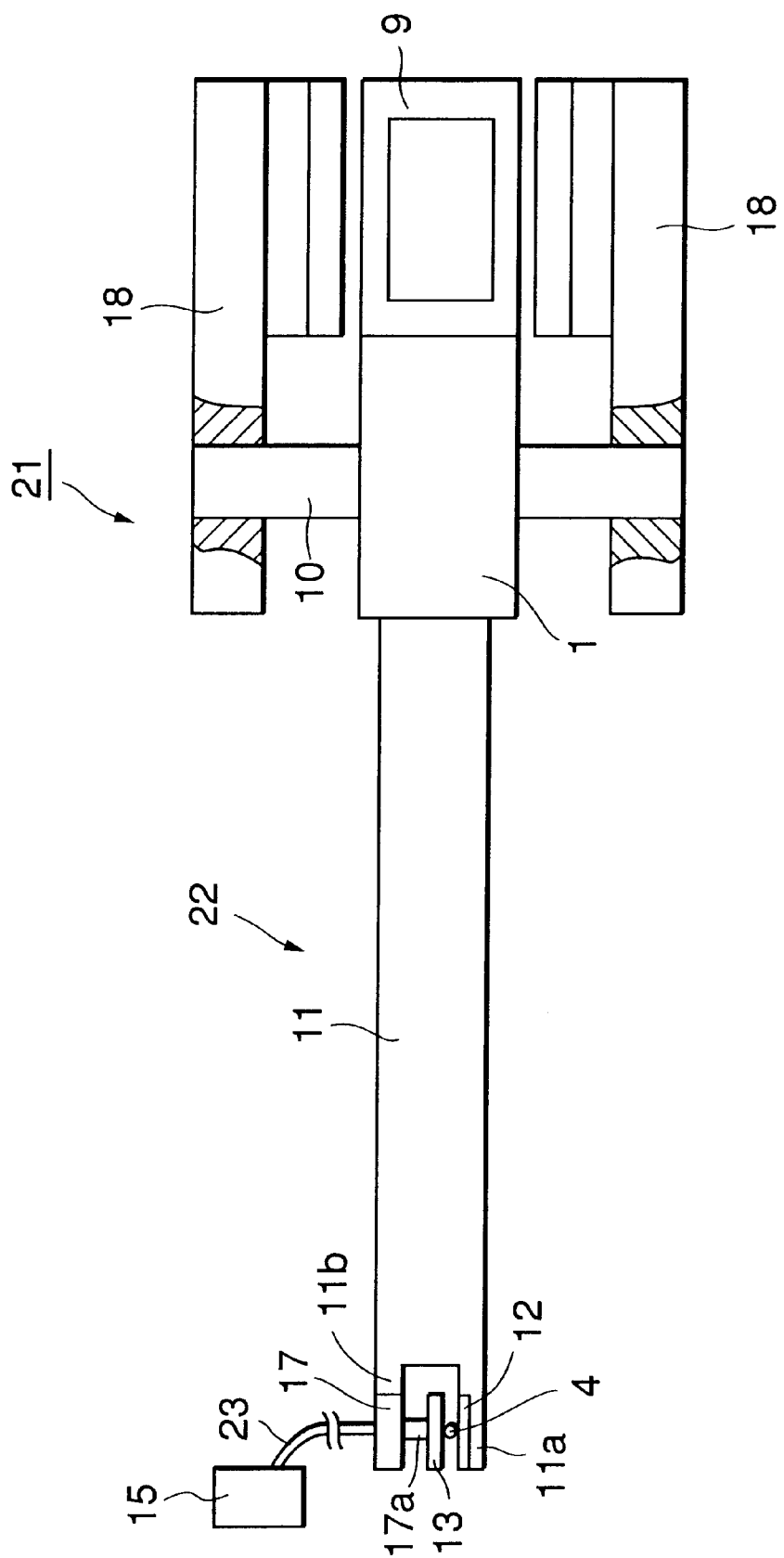

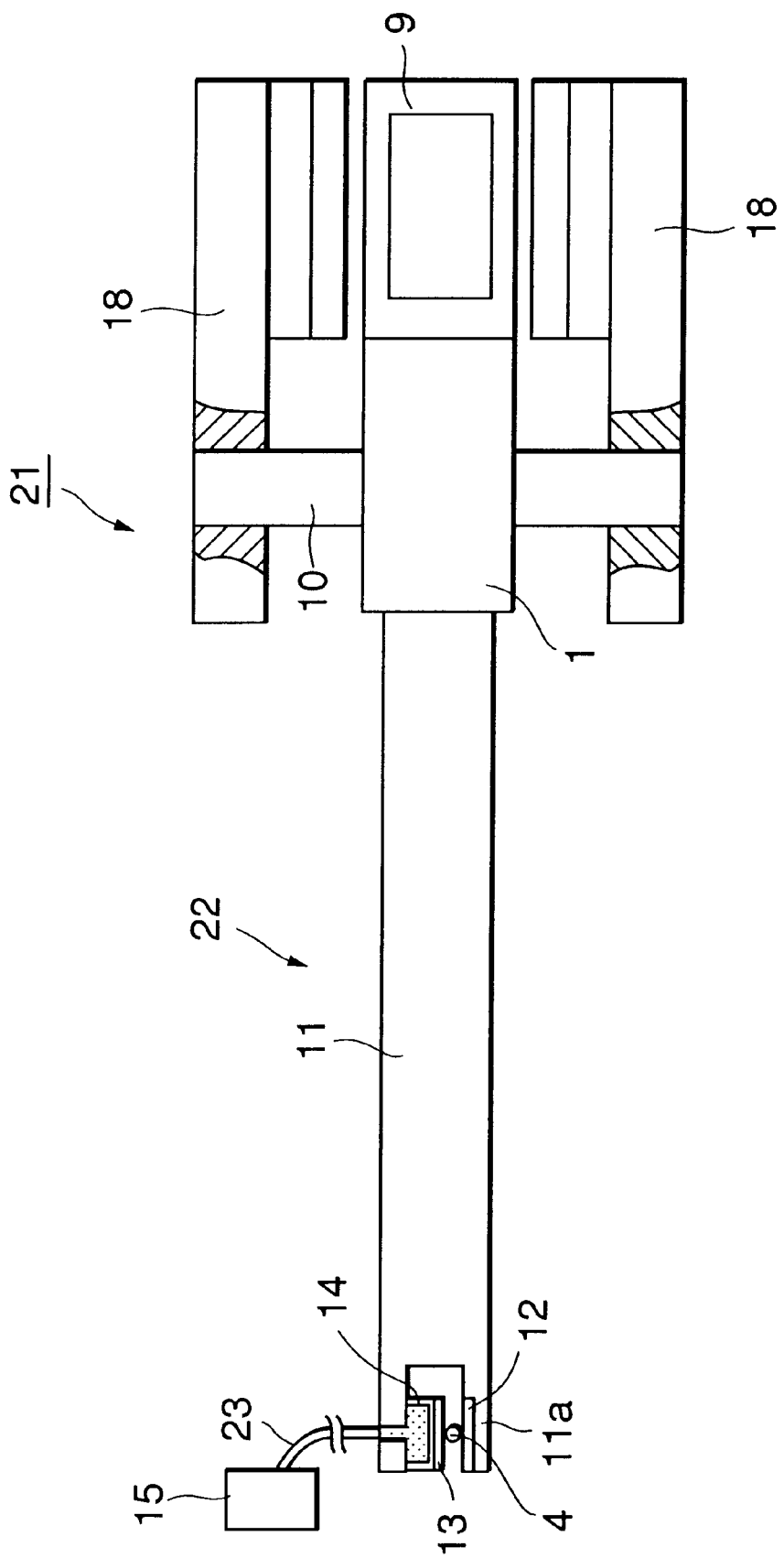

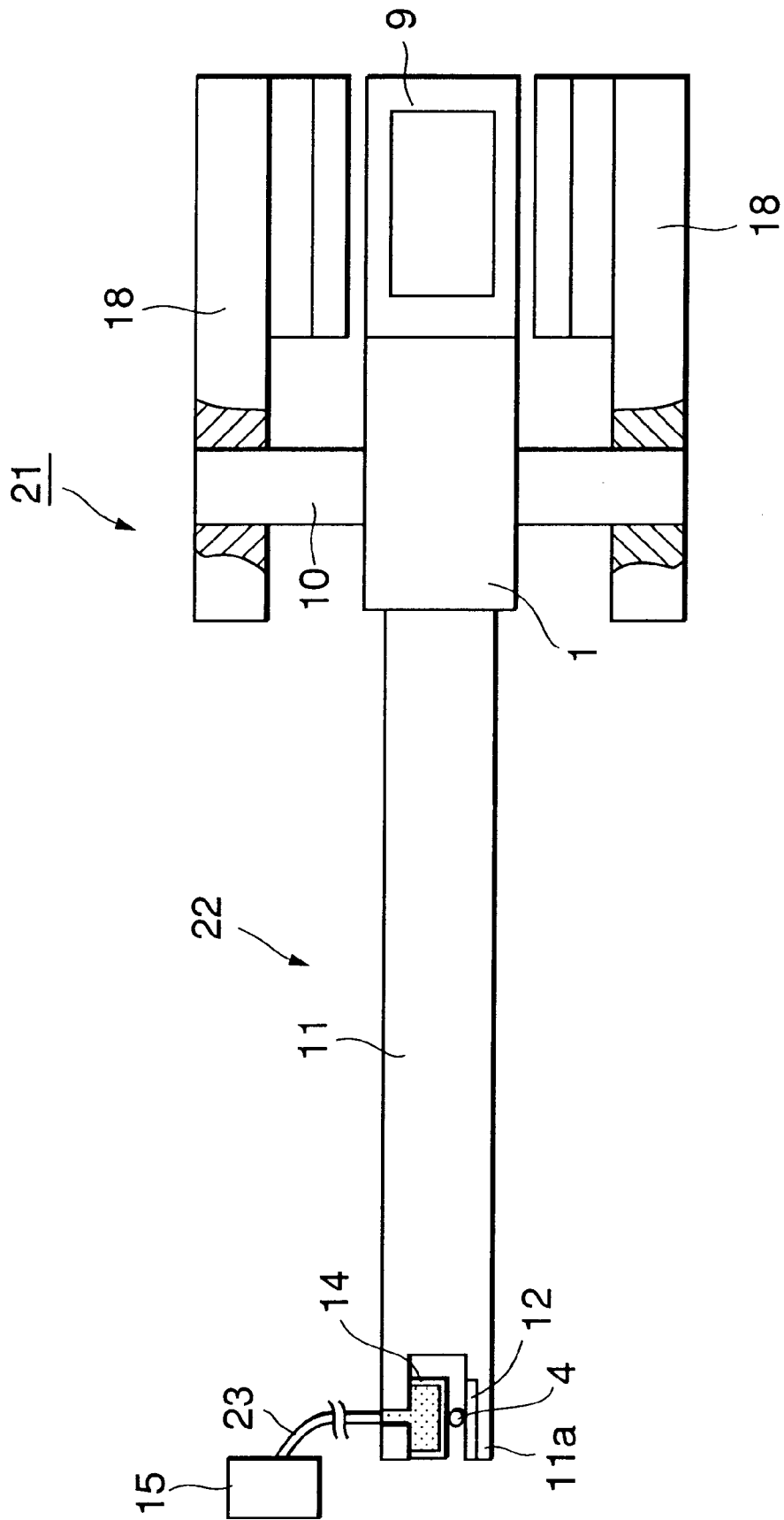

WIRE BONDING APPARATUS HAVING WIRE CLAMP

BACKGROUND OF THE INVENTION

1. Field of the Invention

The present invention relates to a wire bonding apparatus and, in particular, to a wire bonding apparatus equipped with a structure for reducing inertia during operation in a Z-direction rotating portion including a wire clamp.

2. Description of the Related Art

FIG. 1 is a plan view showing an example of a conventional wire bonding apparatus (wire bonder). A wire bonding apparatus 19 comprises an XY stage (not shown), a base 18 mounted on the XY stage, a rotating arm rotating (swinging) around the rotation spindle 10 with respect to the base 18, a Z-axis VCM (voice coil motor) 9 provided at behind side of the rotating arm 1, and a wire clamp 20 provided at front side of the rotating arm 1.

The wire clamp 20 comprises a stationary clamp member 5 extending at front side of the rotating arm 1, a movable clamp member 6 rotatable around a pivot 8 with respect to the stationary clamp member 5 and adapted to grip a gold wire 4 between the forward end portion of the movable clamp member 6 and the forward end portion of the stationary clamp member 5, and a clamping VCM movable coil 7 having a protruding member protruding from or retracting into a coil main body secured to the stationary clamp member 5.

FIG. 2 is a side view of FIG. 1. From a below part of the rotating arm 1, there is provided a bonding tool 3 extending parallel to the clamp members 5 and 6, and a capillary 2 is secured to the forward end portion of the bonding tool 3. In this wire bonding apparatus 19, when the movable clamp member 6 rotates with respect to stationary clamp member 5 through expansion and contraction of the clamping VCM movable coil 7, the thin gold wire 4 as the bonding wire inserted into the capillary 2 is gripped or released by the forward end portions of the clamp members 5 and 6. When necessary, the rotating arm 1 rotates at a high speed around the rotation spindle 10 by the driving of the Z-axis VCM 9, with the Z-direction rotation portion including the wire clamp 20 and the bonding tool 3 being mounted thereon.

FIG. 3 is a diagram showing an operational sequence of the conventional wire bonding apparatus. First, in a state in which the gold wire 4 passed through the capillary 2 is not gripped by the wire clamp 20, the Z-direction rotation portion including the wire clamp 20 and the bonding tool 3 is lowered at a high speed (a). Further, search on the bonding part is executed in (b), US junction is effected in (c), a predetermined amount of the gold wire 4 is reversed in (d), loop-up is effected in (e), and then loop-down is effected in (f).

Next, a second search is executed in (g), and a second bonding (US junction) is effected in (h). Subsequently, feed-up is effected in (i), and, in a state in which the gold wire 4 is gripped by the driving of the clamping VCM movable coil 7, a high-speed ascent is effected by the driving of the Z-axis VCM 9 in (j). After cutting the gold wire 4 connected at the second bonding point, sparking is performed and releasing the wire clamp 20, and the gold ball due to the sparking is raised in (k).

As described above, in the wire bonding apparatus 19, the Z-direction rotating portion rotates at a high speed in the Z-direction, so that in order to restrain vibration and realize a high speed rotation, it is important to reduce the inertia as much as possible. However, in the conventional wire bonding 19, particularly the wire clamp 20 in the Z-direction rotating portion has a solid actuator of a relatively large mass like the clamping VCM movable coil 7, or, in some cases, has a force conversion mechanism which is solid and of a large mass, so that there is a limitation to the reduction of inertia.

SUMMARY OF THE INVENTION

In view of the above problem in the prior art, it is an object of the present invention to provide a wire bonding apparatus which is of a structure as simple and as light as possible, which substantially reduces the inertia in a Z-direction rotating portion rotating at a high speed in the Z-direction, and which is capable of restraining vibration and realizing a stable high-speed rotation of the Z-direction rotating portion.

To achieve the above object, there is provided, in accordance with the present invention, a wire bonding apparatus which comprises a wire clamp capable of moving horizontally in X- and Y-directions perpendicular to each other in the same plane level and rotatable in Z-direction perpendicular to the X- and Y-directions, and a driving means imparting a wire gripping force to the wire clamp. The wire clamp includes a gripping member for gripping a bonding wire; the gripping member can be varied its shape by a fluid supplied by the driving means.

In the wire bonding apparatus of the present invention, a relatively light gripping member which has only to have the capability of effecting a variation in shape is arranged in the wire clamp, and a fluid supply portion for supplying a fluid having a relatively large mass can be arranged on a section different from the Z-direction rotating portion including the wire clamp being present. Due to this arrangement, the wire clamp is substantially reduced in weight, and the inertia in the Z-direction rotating portion is substantially reduced, making it possible to realize a stable high-speed rotation of the Z-direction rotating portion while restraining vibration.

More specifically, the fluid supply portion for supplying a fluid to the gripping member can be arranged on a section of the base which supports the Z-direction rotating portion including the wire clamp at its different section.

Further, it is also desirable that the wire clamp is equipped with a clamp base member whose forward end is formed as a fork shape, and that the gripping member is provided on one protrusion of the fork shape and has an elastic sack-like member expanding toward the other protrusion through introduction of a fluid. In this case, it is possible to obtain, by a very simple structure, the function of a wire clamp gripping/releasing the wire through introduction of a fluid.

Further, it is desirable that there is provided at the forward end of the clamp base member a plate spring member guiding the elastic sack-like member changing its shape with respect to the clamp base member. This helps to stabilize the variation in the shape of the elastic sack-like member.

Preferably, the elastic sack-like member grips the bonding wire with the other protrusion directly or through the intermediate member. By using intermediate member, it is possible to select the gripping condition in the wire clamp.

Alternatively, it is also desirable for the wire clamp to be equipped with a clamp base member whose forward end portion is formed as a fork shape, and the gripping member is provided on one protrusion of the fork shape. The gripping member includes a cylinder formed in the one protrusion and a piston inserted in the cylinder and stretched out toward the other protrusion by introduction of the fluid.

In this case, due to the simple construction using no elastic sack-like member, it is possible to obtain the function of a wire clamp gripping/releasing a wire through introduction of a fluid.

In another aspect of the present invention, there is provided a wire-bonding apparatus which comprises a wire clamp capable of moving horizontally in X- and Y-directions and rotatable in s Z-direction perpendicular to the X- and Y-directions; and a driving means imparting a wire gripping force to the wire clamp. The wire clamp includes a gripping member for gripping a bonding wire; the gripping member can be varied its shape by a volume of a fluid previously sealed in. The driving means is a means of changing the temperature of the fluid to change the volume of the fluid to generate a wire gripping force.

In the latter wire bonding apparatus of the present invention also, a relatively light gripping member is arranged on the wire clamp, and lightweight heater may be provide on the gripping member. On the other hand, a electric current control portion having a relatively large mass and adapted to supply or cut off electric current to the heater through a lead wire can be arranged in a section different from the Z-direction rotating portion being provided. Therefore, the weight of the wire clamp is substantially reduced, and it is possible to obtain the same effect as that of the former wire bonding apparatus.

BRIEF DESCRIPTION OF THE DRAWINGS

In the accompanying drawings:

FIG. 2 is a side view of the wire bonding apparatus shown in FIG. 1;

FIG. 3 is a diagram showing the operational sequence of a wire bonding apparatus;

FIG. 4 is a plan view showing the construction of a wire bonding apparatus according to a first embodiment of the present invention;

FIG. 5 is a side view of the wire bonding apparatus shown in FIG. 4;

FIGS. 6A and 6B are enlarged views of a forward end portion of clamp base member, in which FIG. 6A shows a state before gripping operation, and FIG. 6B shows a state after gripping operation;

FIG. 7 is a plan view showing a wire bonding apparatus according to a second embodiment of the present invention;

FIG. 8 is a plan view showing a wire bonding apparatus according to a third embodiment of the present invention;

FIG. 9 is a plan view showing a wire bonding apparatus according to a fourth embodiment of the present invention.

DESCRIPTION OF THE PREFERRED EMBODIMENTS

Figure 1:
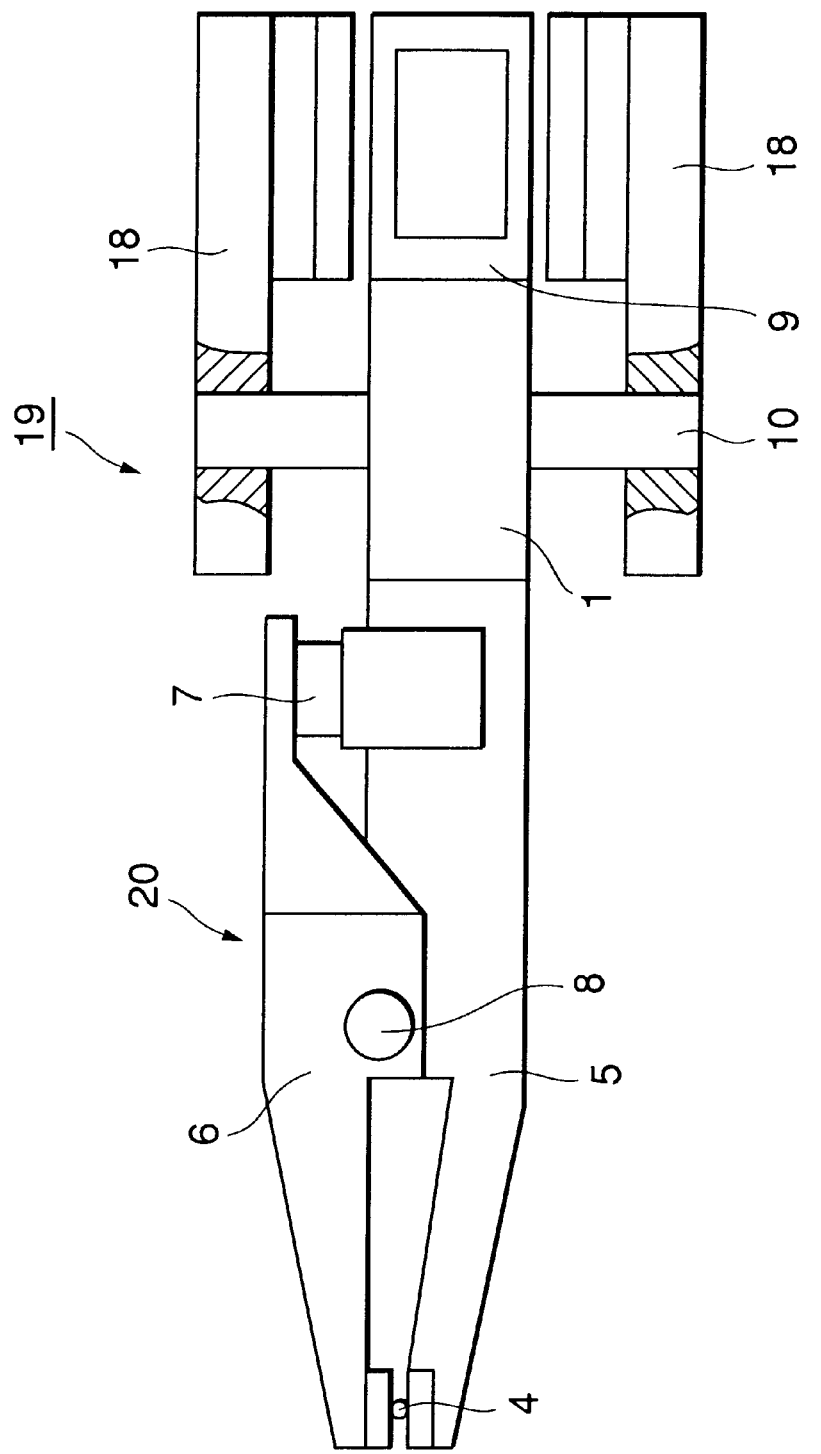
FIG. 1 is a plan view showing an example of a conventional wire bonding apparatus.

Embodiments of the present invention will now be described in detail with reference to the drawings. FIG. 4 is a plan view showing the construction of a wire bonding apparatus (wire bonder) according to the first embodiment of the present invention.

The wire bonding apparatus 21 comprises an XY stage (not shown) capable of moving horizontally in the X- and Y-directions perpendicular to each other in a same plane level, a base 18 arranged on the XY stage and adapted to move in the X- and Y-directions by the XY stage, a rotating arm 1 rotatable (swing) with respect to the base 18 around a rotation spindle 10 supported by the base 18 and extending horizontally, a Z-axis VCM (Voice Coil Motor) 9 provided behind side of the rotating arm 1, and a wire clamp 22 provided in front of the rotating arm 1.

The wire clamp 22, which is supported by the base 18 through the intermediation of the rotating arm 1 and the rotation spindle 10, has a clamp base member 11 extending in front of the rotating arm 1 from the XY stage side. The forward end portion of the clamp base member 11 is formed as a fork shape. A flat stationary wire gripping member 12 is attached to a step portion 11c in the inner surface of one protrusion 11a of the fork shape, and a flat movable wire gripping member 13 is provided on the inner surface of the other protrusion 11b through the intermediation of an elastic sack-like member (gripping member) 14.

A fluid control portion (fluid supply portion) 15 is arranged on a section different from the Z-direction rotating portion rotating in the Z-direction including the wire clamp 22 and the bonding tool 3 being provided. That is, the fluid control portion (fluid supply portion) 15 is arranged on a section, for example, of the base 18 or on some other section (not shown) where the Z-direction rotating portion including the wire clamp 22 and the bonding tool 3 is not present.

The fluid control portion 15 is equipped with a pump adapted to send out a fluid, such as oil or air, by a plunger or the like. While controlling the operation of this pump, the amount of fluid introduced into the elastic sack-like member 14 is controlled to adjust the expanding amount thereof.

The elastic sack-like member 14 is formed of a shrinkable material such as rubber or a synthetic resin in a substantially bowl-shaped configuration, and is caused to expand by a fluid introduced from the fluid control portion 15 by way of a tube 23 and a through-hole lid formed in the protrusion 11b. The opening of the substantially bowl-shaped elastic sack-like member 14 is attached in a liquid-tight manner to the inner surface of the protrusion 11b around the through-hole 11d. When it expands, a movable wire gripping member 13 is directly operated toward a stationary wire gripping member 12 (protrusion 11a), whereby the wire gripping force of the wire clamp 22 is generated.

Further, at the forward end of the clamp base member 11, there are arranged parallel plate springs (leaf spring members) 16 for guiding the movable wire gripping member 13 with respect to the clamp base member 11.

FIG. 5 is a side view of FIG. 4. From the lower part of the rotating arm 1, there is provided a bonding tool 3 extending parallel to the clamp base member 11, and a capillary 2 is fixed to the forward end portion of the bonding tool 3. A thin gold wire 4 as a bonding wire inserted into the capillary 2 is gripped/released above the capillary 2 by the wire clamp 22.

Figure 6A:
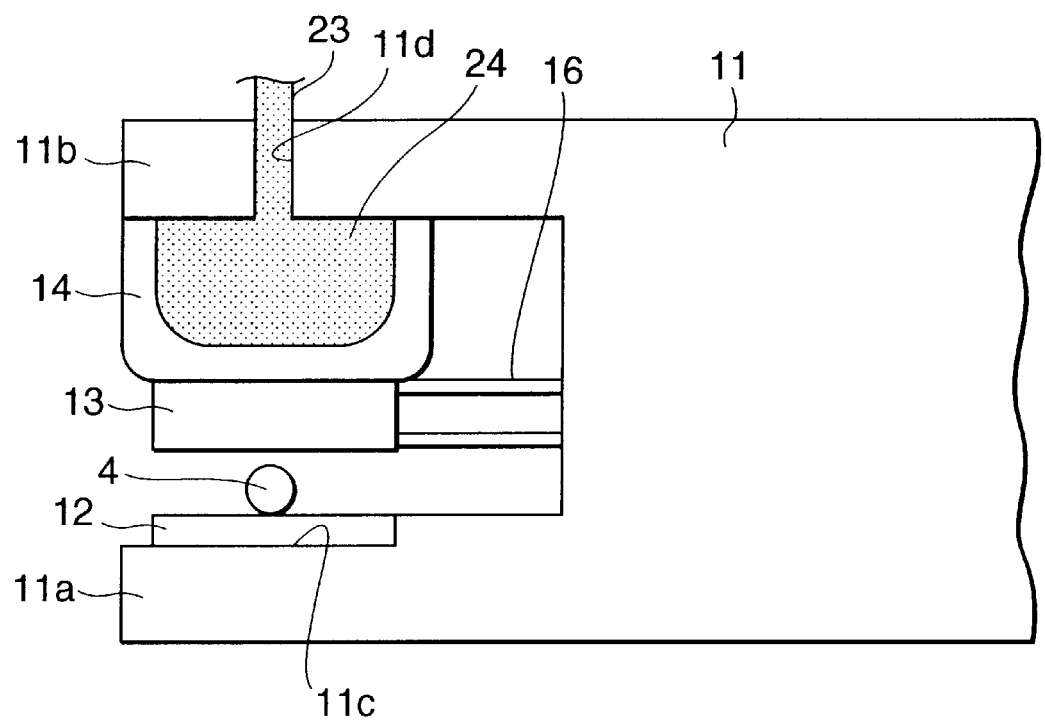
Figure 6B:
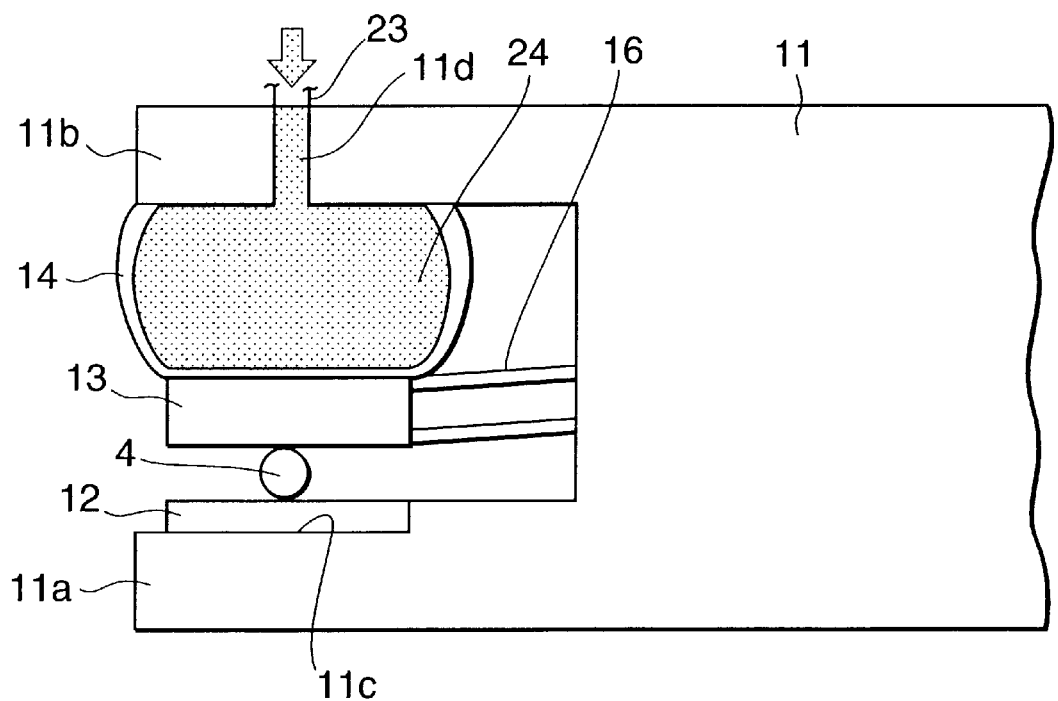

FIGS. 6A and 6B are enlarged views of the forward end portion of the clamp base member 11, in which FIG. 6A shows a state before gripping operation, and FIG. 6B shows a state after gripping operation. The operation of the wire bonder 21 of this embodiment will be described with reference to FIGS. 4, 5, 6A, and 6B.

First, the gold wire 4 is inserted into the capillary 2, and the gold wire 4 is gripped at a position above the capillary 2. Prior to this gripping operation, the movable wire gripping member 13 is at a position most spaced apart from the stationary wire gripping member 12 due to the shrinkage of the elastic sack-like member 14 (FIG. 6A). When in this condition the fluid 24 is introduced into the elastic sack-like member 14 from the fluid control portion 15, the elastic sack-like member 14 expands while being guided by the parallel plate springs 16, so that the movable wire gripping member 13 approaches the stationary wire gripping member 12 to hold the gold wire (FIG. 6B).

On the other hand, when the gold wire 4 is released as needed, the fluid 24 flows out of the elastic sack-like member 14 by the operation of the fluid control portion 15, and the elastic sack-like member 14 shrinks due to the slight biasing force of the plate springs 16 and the shrinking force of the elastic sack-like member 14 itself. In this way, the movable wire gripping member 13 is separated from the stationary wire gripping member 12 while being guided by the parallel plate springs 16 to release the gold wire 4.

As described above, the wire clamp 22 which grips/releases the gold wire 4 at the forward end of the clamp base member 11 executes a processing similar to the sequence described with reference to FIG. 3. First, with the gold wire 4 inserted into the capillary 2 not being gripped, the Z-direction rotating portion including the wire clamp 20 and the bonding tool 3 is lowered at a high speed. Then, search of the bonding portion is executed to effect US junction, and after reversing the gold wire 4 by a predetermined amount, loop-up is effected, and further, after loop-down, search is executed for the second time to effect US junction.

Feed-up is continued and in the state in which the gold wire 4 is gripped by the driving of the fluid control portion 15 and the elastic sack-like member 14, the Z-direction rotating portion is raised at a high speed by driving the Z-axis VCM 9, and after cutting the gold wire 4 connected at the second bonding point, sparking is effected and releasing the wire clamp 22, and the gold ball due to the sparking is raised.

As described above, in the wire bonding apparatus of this embodiment, the fluid control portion 15 having a relatively large mass is arranged on a section different from the Z-direction rotating portion including the wire clamp 22 (and the bonding tool 3) being present, and only the elastic sack-like member 14 which is relatively light and which has only to have the capability of undergoing deformation is arranged on the wire clamp 22.

In this way, in this wire bonding apparatus, the conventional solid actuator having a large mass and the force conversion mechanism having a large mass and provided on the Z-direction rotating portion are omitted to substantially reduce the weight of the wire clamp 22, and the inertia in the Z-direction rotating portion is substantially reduced, whereby a high-speed stable rotation of the Z-direction rotating portion is realized while restraining vibration.

FIG. 7 is a plan view showing a wire bonding apparatus according to the second embodiment of the present invention. The basic construction of the wire bonding apparatus of this embodiment is substantially the same as that of the first embodiment. In this embodiment, the wire bonding apparatus 21 does not have the elastic sack-like member 14, the parallel plate springs 16, etc. at the forward end of the clamp base member 11. Instead, it has a cylinder 17 is formed in the forward end portion of the protrusion 11b.

The fluid from the fluid control portion 15 is introduced into and drained into the cylinder 17 through the tube 23, whereby a piston 17a inserted in the cylinder 17 protrudes or retracts. Due to this construction, the cylinder 17 causes the movable wire gripping member 13 fixed to the forward end portion of the piston 17a to move toward or away from the stationary wire gripping member 12 on the protrusion 11a side to grip or release the gold wire 4. The second embodiment constructed as described above provides the same effect as the first embodiment.

FIG. 8 is a plan view showing a wire bonding apparatus according to the third embodiment of the present invention. The basic construction of this embodiment is substantially the same as that of the wire bonding apparatus of the first embodiment. The wire bonding apparatus 21 of this embodiment differs from the first embodiment in that it does not have the parallel plate springs 16 at the forward end of the clamp base member 11. Also the third embodiment constructed as described above provides the same effect as the first embodiment.

FIG. 9 is a plan view of a wire bonding apparatus according to the fourth embodiment of the present invention. The basic construction of this embodiment is substantially the same as that of the wire bonding apparatus the first embodiment. The wire bonding apparatus 21 of this embodiment differs from the first embodiment in that it has no movable wire gripping member 13 at the forward end of the clamp base member 11.

Also this embodiment, which has no movable wire gripping member 13 and in which the gold wire 4 is directly gripped/released by the elastic sack-like member 14, provides the same effect as the first embodiment. When the parallel plate springs 16 are used in this embodiment, the parallel plate springs 16 are directly mounted to the elastic sack-like member 14 instead of being mounted to the movable wire gripping member 13 in FIG. 4. In this case also, the elastic sack-like member 14 can be guided in a stable manner by the parallel plate springs 16.

Figure 10:
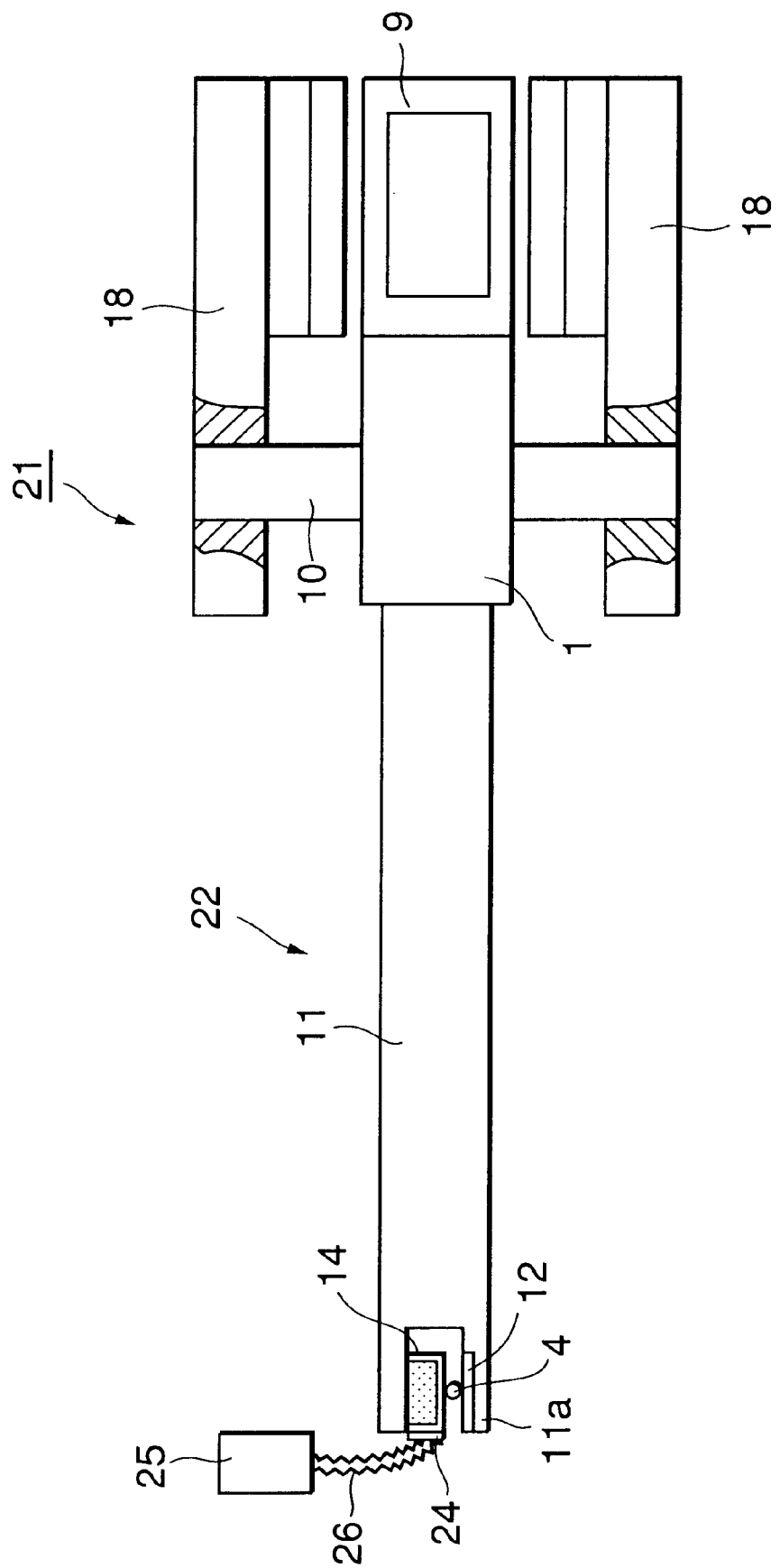
FIG. 10 is a plan view showing a wire bonding apparatus according to a fifth embodiment of the present invention.

FIG. 10 is a plan view showing a wire bonding apparatus according to the fifth embodiment of the present invention. In this embodiment, the fluid control portion 15, the tube 23, the through-hole 11d, the movable wire gripping member 13, and the parallel plate springs 16 of the first embodiment are not provided. The wire gripping force is obtained through changes in volume at the time of temperature change of the fluid 24 previously sealed in the elastic sack-like member 14 instead of through changes in the configuration of the elastic sack-like member 14 by the fluid introduced.

That is, in this embodiment, a lightweight heater 27 is arranged on the elastic sack-like member 14, and there is provided on a section different from the Z-direction rotating portion a current control portion 25 for supplying electric current to the heater 27 through a lead wire 26 or cutting off the supply. Due to this construction, the elastic sack-like member 14 is caused to expand through changes in volume at the time of temperature change of the fluid 24 previously sealed in, and a wire gripping force can be generated, so that it is possible to substantially possible to reduce the weight of the wire clamp and to obtain the same effect as that of the above embodiments. In this embodiment also, it is possible to appropriately use the movable wire gripping member 13, the parallel plate springs 16, etc. used in the first embodiment. In that case also, the same effect can be obtained.

The wire bonding apparatus of the present invention is not restricted to the constructions of the above-described preferred embodiments. The present invention also covers various modifications and variations of the wire bonding apparatus of the above-described embodiments.

As described above, the wire bonding apparatus of the present invention has a structure as simple and as light as possible and makes it possible to substantially reduce the inertia in the Z-direction rotating portion rotating at a high speed in the Z-direction, realizing a stable high-speed rotation of the Z-direction rotating portion while restraining vibration.

What is claimed is:

1. A wire bonding apparatus comprising:

a wire clamp capable of moving in X- and Y-directions and rotatable in Z-direction perpendicular to the X- and Y-directions; and a driving means imparting a wire gripping force to said wire clamp;

said wire clamp including a gripping member for gripping a bonding wire; said gripping member being varied its shape by a fluid supplied by said driving means.

2. A wire bonding apparatus according to claim 1, wherein a said driving means includes a fluid supply portion for supplying said fluid; and said fluid supply portion is provided on base movable horizontally in X- and Y-directions by XY stage.

3. A wire bonding apparatus according to claim 1 or 2, wherein said wire clamp includes a clamp base member whose forward end is formed as a fork shape, and said gripping member is provided on one protrusion of said fork shape and has an elastic sack member expanding toward the other protrusion through introduction of a fluid.

4. A wire bonding apparatus according to claim 3, wherein at the forward end of said clamp base member, a plate spring member guiding said elastic sack member changing its shape with respect to said clamp base member is further provided.

5. A wire bonding apparatus according to claim 3 wherein said elastic sack member grips said bonding wire directly or through an intermediate member.

6. A wire bonding apparatus according to claim 4, wherein said elastic sack member grips said bonding wire directly or through an intermediate member.

7. A wire bonding apparatus according to claim 1 or 2, wherein said wire clamp includes a clamp base member whose forward end portion is formed as a fork shape, and said gripping member is provided on one protrusion of said fork shape; said gripping member includes a cylinder formed in said one protrusion and a piston inserted in said cylinder and stretched out toward the other protrusion by introduction of said fluid.

8. A wire bonding apparatus comprising:

a wire clamp capable of moving in X- and Y-directions and rotatable in s Z-direction perpendicular to the X- and Y-directions; and a driving means imparting a wire gripping force to said wire clamp, wherein said wire clamp includes a gripping member for gripping a bonding wire; said gripping member being varied its shape by a volume of a fluid previously sealed in; and said driving means is a means of changing the temperature of said fluid to change said volume of said fluid to generate a wire gripping force.

* * * * *